United States Patent [19]

Suzuki et al.

[11] Patent Number: 4,620,785

[45] Date of Patent: Nov. 4, 1986

[54] SHEET-LIKE MEMBER HAVING ALIGNMENT MARKS AND AN ALIGNMENT APPARATUS FOR THE SAME

[75] Inventors: Akiyoshi Suzuki; Hiroshi Sato, both of Tokyo; Ichiro Ishiyama, Kawasaki, all of Japan

[73] Assignee: Canon Kabushiki Kaisha, Tokyo, Japan

[21] Appl. No.: 553,814

[22] Filed: Nov. 21, 1983

[30] Foreign Application Priority Data

Dec. 1, 1982 [JP] Japan ................................ 57-210913
Nov. 19, 1983 [JP] Japan ................................ 58-217111

[51] Int. Cl.$^4$ ............................................. G03B 27/42
[52] U.S. Cl. ........................................ 355/53; 355/43; 355/45
[58] Field of Search ......................... 355/43, 45, 53, 54

[56] References Cited

U.S. PATENT DOCUMENTS

| | | | |
|---|---|---|---|
| 3,067,284 | 12/1962 | Baldwin | 352/109 |
| 3,494,695 | 2/1970 | Sollima et al. | 355/53 |
| 3,569,718 | 3/1971 | Borner | 355/53 |
| 3,844,655 | 10/1974 | Johannsmeier | 355/43 |
| 4,395,117 | 7/1983 | Suzuki | 355/43 |
| 4,437,758 | 3/1984 | Suzuki | 355/53 |
| 4,452,526 | 6/1984 | Johannsmeier | 355/54 |

Primary Examiner—Monroe H. Hayes
Attorney, Agent, or Firm—Fitzpatrick, Cella, Harper & Scinto

[57] ABSTRACT

A sheet-like member, such as a reticle, mask or wafer, has alignment marks, which are staggered about a pattern area thereof. The arrangement of the alignment marks is effective to enhance the degree of alignment and also to avoid undesirable overlapping of the reticle mark and the wafer mark.

4 Claims, 15 Drawing Figures

SHEET-LIKE MEMBER HAVING ALIGNMENT MARKS AND AN ALIGNMENT APPARATUS FOR THE SAME

BACKGROUND OF THE INVENTION

The present invention relates to a sheet-like member having alignment marks and an alignment apparatus for the same, and more particularly to a reticle, mask and wafer and apparatus used therewith for manufacturing semiconductor circuits.

As a typical example of an aligner for automatically aligning plural objects, there is an aligner for manufacturing semiconductor devices, such as IC, (integrated circuits) LSI (large scale integrated circuits) and so on. Those IC and LSI are manufactured by superposing a number of complicated circuit patterns. The tendency is toward higher processing speed and higher density of patterns, the width of the circuit lines is continuously required to be smaller and smaller, and the accuracy of alignment is required to be higher and higher even to the extent of orders of sub-microns. To meet such requirements, there has been developed an aligner of step-and-repeat type, which is called a stepper. In a stepper, a pattern of a reticle is projected onto a wafer at a unit or reduced scale. Because of the limit of the design of the projection lens optical system, the projection area is necessarily limited or small so that the entire wafer surface cannot generally be exposed at one shot. Therefore, to cover the entire surface, the pattern is projected on a part of the wafer surface nd stepped to the next part and projected, and this is repeated throughout a wafer. With the increase of the size of the wafer, the number of steps required for one wafer increases so that the time required for processing one wafer increases. On the other hand, prior to each projection of a pattern, i.e., exposure of the wafer to the pattern, the reticle and the wafer must have been aligned. Therefore, how they are aligned is important from the standpoint of alignment accuracy and the period required for alignment. It is known, as OFF-AXIS alignment, to first correctly place one of wafer and mask at a predetermined position outside the exposure station and then move it toward the exposure position by a predetermined distance which is assured by a laser interferometer. This type of alignment process enables a high speed operation, but involves problems that the alignment cannot be directly confined at the exposure station; that it cannot meet a nonlinear local distortion which may be created in the wafer with experiences of wafer processing; and that the accuracy of the stage movement monitoring may affect the alignment.

There is a so-called TTL type apparatus wherein the wafer is observed through a projection lens adjacent the exposure position to align it with the reticle. This type of device can meet the local distortion of the wafer and can avoid the inaccuracy in the wafer stage movement so that a better alignment between the reticle and wafer can be expected.

Figure 1:
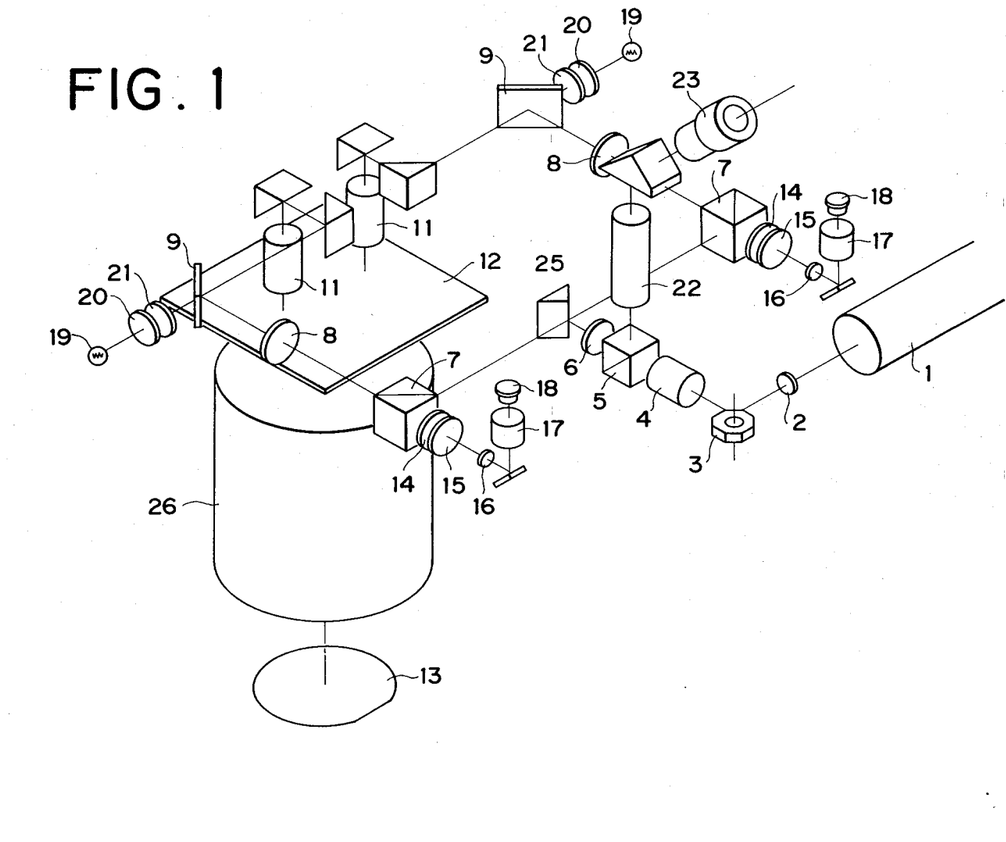
FIG. 1 shows an arrangement of a prior art optical system.

For the TTL system, laser beam scanning is known for use in the alignment operation. An example thereof is described in a Japanese Laid-Open Patent Application No. 54-53562 which has been filed by the Assignee of the present application. FIG. 1 shows a schematic view of the device disclosed therein, for the sake of explanation. A single laser beam from a single laser beam source 1 is split or divided into two beams, which are then directed to lefthand and righthand objective optical systems 11, thus allowing detection of the displacement or degree of misalignment between the reticle 12 and wafer 13 at two positions. The two position detection allows two kinds of displacement, that is, X and Y direction (translational) displacement and $\theta$ (rotational) displacement to be corrected, by moving one of the reticle or the wafer relative to the other.

The optical system disclosed in FIG. 1 includes a condenser lens 2 for focusing the laser beam, a polygonal mirror 3, an f-$\theta$ lens 4 and a beam splitter 5. The laser beam emitted from the laser beam generator 1 is deflected for scanning by the polygonal mirror 3 and then is incident on the beam splitter 5 and other elements. The system further includes a field lens 6, a view field splitting prism 25 which is effective also to divide the scanning laser beam into two beams. Because of the dual functions, the prism 25 may be said to be a view field dividing and spatial dividing prism. The beam is passed through or reflected by a polarization beam splitter 7, a relay lens 8 and a beam splitter 9 and reaches the objective lens 11, by which it is imaged on the objects to scan the same. The system of optical elements extending from a pupil imaging lens 14 to a detector 18 constitutes a photoelectric detection system. The device further includes a chromatic filter 15; a spatial frequency filter 16 for blocking specularly reflected (by the reticle or wafer) beams but allowing scattered reflected beams to transmit; an illumination optical system having a condenser lens 17, a light source 19, a condenser lens 20 and a chromatic filter 21; and an observation optical system having an erector and an eye piece. The function and operation of those elements are explained in detail in the above-identified Patent Application, so that detailed explanations thereof are omitted for the sake of simplicity.

In this example, the deflected beam, deflected by the polygonal mirror 3, is divided in its deflection range, by the view field dividing prism 25 which is optically conjugate with the reticle 12 and wafer 13, thus using effectively the quantity of light of the laser beam. The deflection line is traverse to the edge of the prism 25. The respective beams divided out by the prism 25 are directed through the respective objective lens 11 to the alignment marks, and scan the same, respectively. The alignment scope having the microscopes has an additional important function, i.e., the observation of the alignment marks. The observation is one of the functions, particularly, in monitoring the state of alignment and initial setting of a reticle. For the observation optical system, it is desired that the images are observed in a natural and easy manner.

Figure 2:
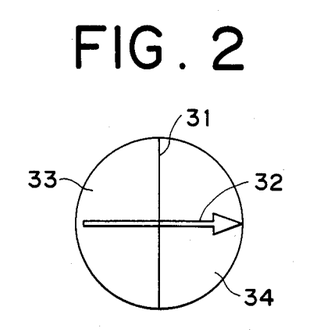
FIG. 2 illustrates a relationship between a scanning beam and a field of view.

FIG. 2 shows the image view fields observed through the eye piece 23 in the arrangement of FIG. 1. In FIG. 2, reference numeral 31 depicts the view field dividing line provided by the edge of the view field splitting prism 25; 32, the scanning line of the laser beam; 33, the view field through the righthand side objective lens; and 34, the view field through the lefthand side objective. The laser beams scan the alignment mark areas in the direction connecting the righthand and lefthand alignment marks. The alignment marks play important roles in manufacturing semiconductor circuits, but do not provide any actual circuit patterns. So, after the wafer has been completely processed, the parts thereof having the alignment marks are the non-usable areas. For this reason, the area occupied by an alignment mark is desirably as small as possible, so as to provide a better yield.

Figure 3:
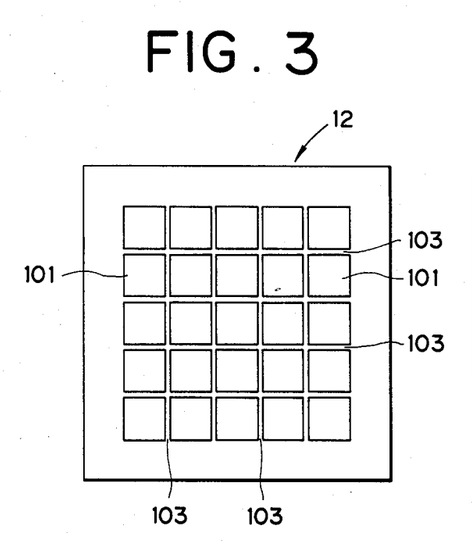
FIG. 3 shows an example of a mask or reticle having plural chip patterns.

FIG. 3 shows an example of a reticle or mask (hereinafter called simply a reticle). If the alignment marks are provided on the scribe lines between adjacent chips 101, they do not require any particular space, so that the above-described problem is solved. Since the scanning laser beam runs in the direction connecting the alignment marks, two alignment marks are arranged along this direction, that is, along and within a scribe line which is near the center of the reticle.

However, in the case of a so-called stepper type exposure and alignment device, inter alia, in the reduction stepper, it is possible that one reticle, in its entity, corresponds to one chip so that there are scribe lines only at the marginal area, that is, no scribe lines are near the center which would be better to accommodate the alignment marks as explained above.

Figure 4:
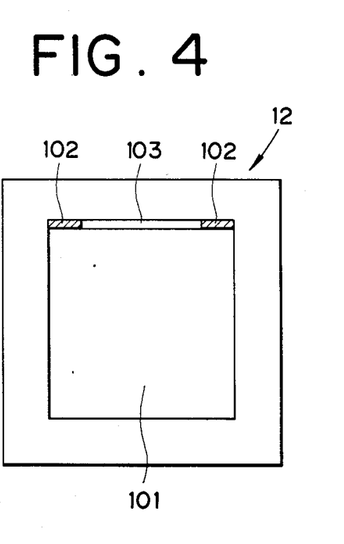
FIG. 4 shows prior art alignment marks for a reticle having a one-chip pattern.

FIG. 4 shows a reticle 12 having a pattern of only one chip 101, wherein the alignment marks are shown by reference numerals 102.

As will be understood from FIG. 4, the two alignment marks 102 are located on a line which is greatly spaced from the center of the reticle 12. Therefore, at the parts of the reticle 12 which are apart from the alignment marks 102, i.e., near the bottom in FIG. 4, the alignment is not very precise, as compared with the area near the alignment mark 102, i.e., the upper side.

The degrading of the alignment caused by the alignment marks 102 located along a line which is far from the center of the reticle 12 is significant when the reticle 12 has a pattern for one chip. This is also a problem when the number of chips whose pattern are formed on the reticle 12 is an odd number, as compared with the case an even number of chips being formed on the reticle 12, since there is no central scribe line in the former case.

In the case where the alignment marks are provided at the opposite peripherals of the reticle pattern area at the same latitude, and the alignment marks of the wafer are located correspondingly, one of several of the reticle alignment marks used with a certain exposure step, i.e., a certain shot, may be overlapped with a wrong one of the wafer alignment marks for the next shot, so that correct alignment for the next shot is not possible.

When a chip pattern on a reticle is projected to a wafer, the wafer is also exposed to the reticle alignment mark patterns. If such an exposed wafer is processed, by for example, development and/or diffusion, the alignment marks on the wafer may be more or less damaged (U.S. Pat. No. 3844655). The damage may be a serious problem, when the wafer thus processed is again subjected to an additional exposure to another pattern in alignment with the existing pattern, since the wafer has to be aligned again with a reticle.

SUMMARY OF THE INVENTION

Accordingly, the principal object of the present invention is to provide a sheet-like member having alignment marks, such as a reticle or mask and wafer, by which the non-uniform alignment which may be caused by the location of the marks can be avoided so that the total alignment precision is improved.

Another object of the present invention is to provide a sheet-like member having an alignment mark, such as a reticle, mask and wafer, by which the alignment marks are so located that the undesirable overlapping of the marks can be avoided.

A further object of the present invention is to provide an alignment apparatus wherein the scanning positions are not on a line.

Another principal object of the present invention is to provide a reticle or mask by which the wafer alignment marks are not adversely affected by the exposure to the alignment marks of the reticle.

A further object of the present invention is to provide a step-and-repeat type aligner wherein the wafer alignment marks are protected from adverse affect which can be caused by the exposure of the wafer to the reticle pattern, and more particularly, the exposure of the wafer alignment mark pattern to the reticle alignment mark pattern.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 5:
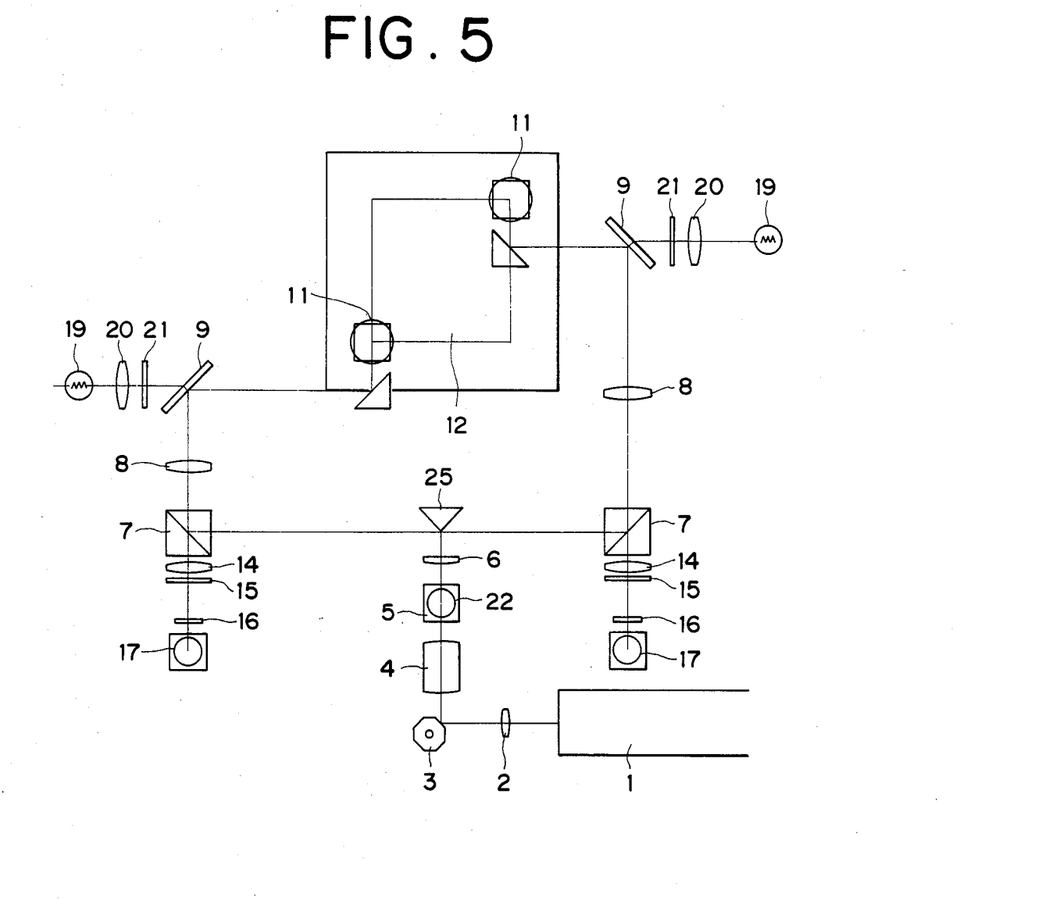
FIG. 5 shows an arrangement of an optical system of an alignment apparatus according to an embodiment of the present invention.

FIG. 5 shows a preferred embodiment of an alignment apparatus usable with a reticle according to the present invention. The optical system shown in this Figure is similar to that of the optical system shown in FIG. 1 some extent, so that the detailed explanation of the similar parts is omitted by assigning the same reference numerals to the element having the similar function. It is common that the laser beam produced by the laser source 1 is deflected for scanning by a polygonal mirror 3 and is directed through the objective lenses 11 to the reticle 12 surface to be scanned thereby. What is different from the FIG. 1 arrangement is in the optical system after the deflected beam has been split by the view field dividing prism 25. The optical systems thereafter are not symmetrical as contrasted with the FIG. 1 arrangement. The areas scanned by the beam, which are also the areas to be observed, on the reticle or mask 12 are staggered. The areas to be observed by the FIG. 5 arrangement are the areas 27 and 28 shown in FIG. 6, while the areas to be scanned by the beams are shown by the hatched areas, i.e., alignment marks X and W. Thus, the alignment marks are accommodated within the scribe street or line. This arrangement of the marks provides a long span between the several marks so that the rotational misalignment can be well corrected. As explained above, by changing a conventional optical system of FIG. 1, an alignment apparatus usable with the reticle 12 of the present invention can be provided.

Figure 6:
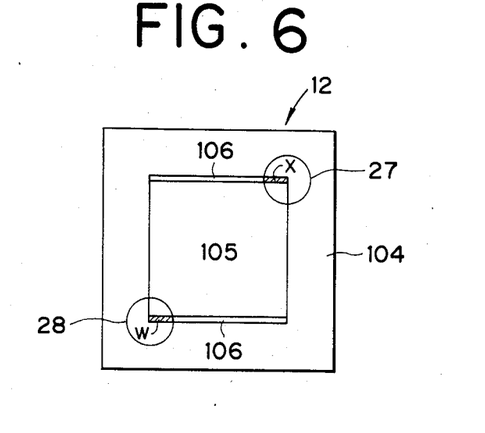
FIG. 6 shows a reticle having alignment marks according to an embodiment of the present invention.

The reticle 12 of FIG. 6 according to the present invention includes a base plate 104 on which there is pattern area 105. The pattern area has a circuit pattern to be repeatedly projected or printed onto a wafer through a projection optical system in a matrix form or in orthogonal arrays. The alignment marks X and W are so disposed that the pattern area is interposed between the alignment marks, which are arranged in staggered fashion with respect to the directions of the orthogonal arrays.

Figure 7:
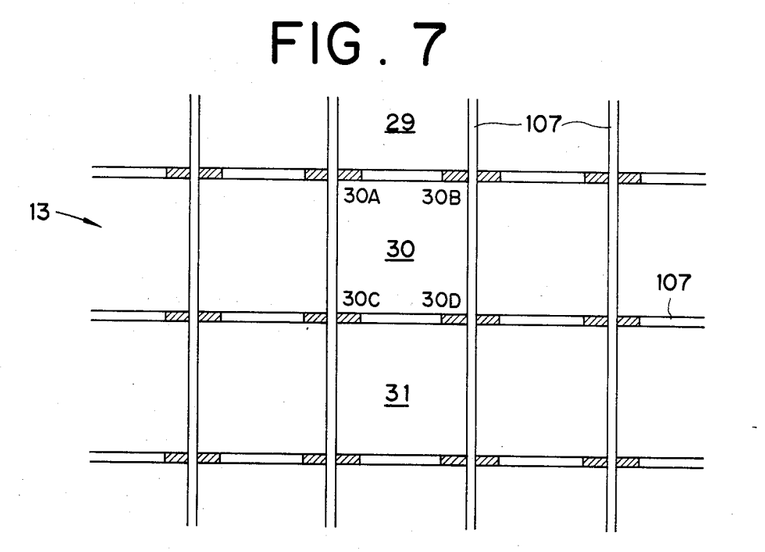
FIG. 7 and FIG. 8 show alignment marks on a wafer usable with the reticle of FIG. 6.
Figure 8:
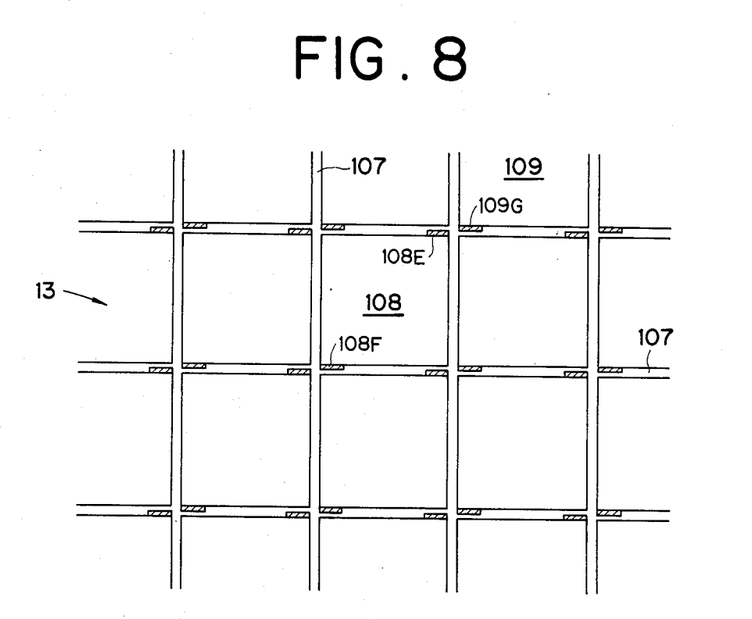

FIGS. 7 and 8 show the alignment marks located on the scribe lines 107 on the wafer 13. The wafer 13 of either of those Figures is repeatedly exposed to a pattern of a one-chip reticle, by step-and-repeat process. The alignment marks are accommodated within the scribe line or streets 107 which define the respective pattern areas in either case, but the exact position of the marks are different between FIG. 7 and FIG. 8. As will be understood from FIG. 6, the alignment marks X and W for a reticle are positioned at upper right and lower left locations as a pair. In FIG. 7, a scribe street 107 is commonly used for an alignment mark of a pattern area and an alignment mark of the adjacent pattern area. For example, around a chip 30, the four marks 30A, 30B, 30C and 30D are provided, but only the two marks 30B (X) and 30C (W) are used for the alignment of the chip 30. The mark 30A is for the upper chip 29, and the mark 30D, for the lower chip 31.

In FIG. 8 arrangement, the street 107 is divided into two narrower sheets, and the alignment marks for a chip are located as near as possible to the associated chip. By using a half of the street for the alignment mark for a chip, the other half can be regarded as being retained for later use. This is advantageous. However, FIG. 7 is advantageous in that a narrower scribe street is sufficient. The recent trend for a narrower scribe street can be met by the FIG. 7 arrangement.

Figure 9A:
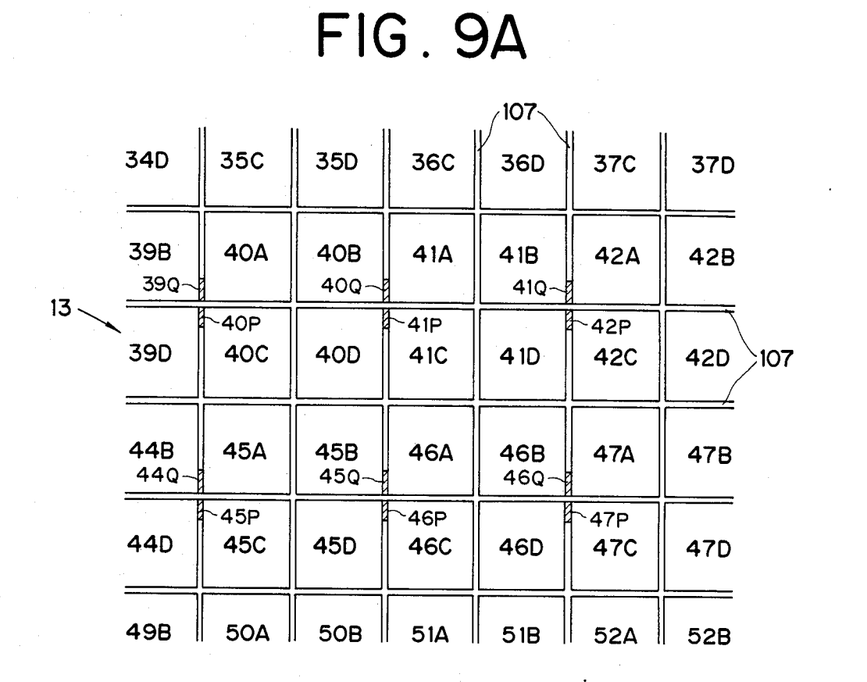
FIG. 9A and FIG. 9B show a wafer or a reticle having alignment marks on the longitudinal scribe line.
Figure 9B:
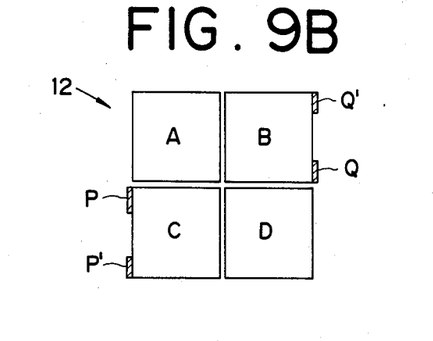

In the foregoing, the alignment marks on the wafer 13 are located along a scribe street which extends in the lateral direction in the Figures. The staggered arrangement is effective in the case where the alignment marks are located along a longitudinal scribe street. FIGS. 9A and 9B show an example of this. In this case, the reticle 12 has four pattern areas A, B, C and D for four chips as shown in FIG. 9B, which are projected by the step-and-repeat process on the wafer 13 (FIG. 9A). The reticle 12 has a pair of alignment marks P and Q in a staggered form at and outside the opposite peripheries. Those marks may be located at the positions shown by P' and Q' as in FIG. 6 arrangement, but they may be located as shown in FIG. 9B by reference numerals P and Q, which are nearer to the center of the reticle. FIG. 9A shows a part of the wafer which has been exposed to the reticle 12 of FIG. 9B by step-and-repeat exposure. This Figure shows the positions of alignment marks on the wafer 13. When, for example, chips 40A, 40B, 40C and 40D are exposed, the alignment marks P and Q on the reticle correspond to the alignment marks 40P and 40Q on the wafer. For the next shot, i.e., when chips 41A, 41B, 41C and 41D are exposed, the alignment marks P and Q on the reticle correspond to the marks 41P and 41Q, respectively. Since the wafer alignment marks 41P and 41Q are not at the same latitude, there is no possibility that an alignment mark on the wafer 13, for a certain shot is overlapped with an alignment mark on the reticle, for the next shot which might result in that the proper alignment cannot be achieved. In FIG. 9A, the chips having the same numeral are the ones simultaneously exposed at one shot.

Figure 10:
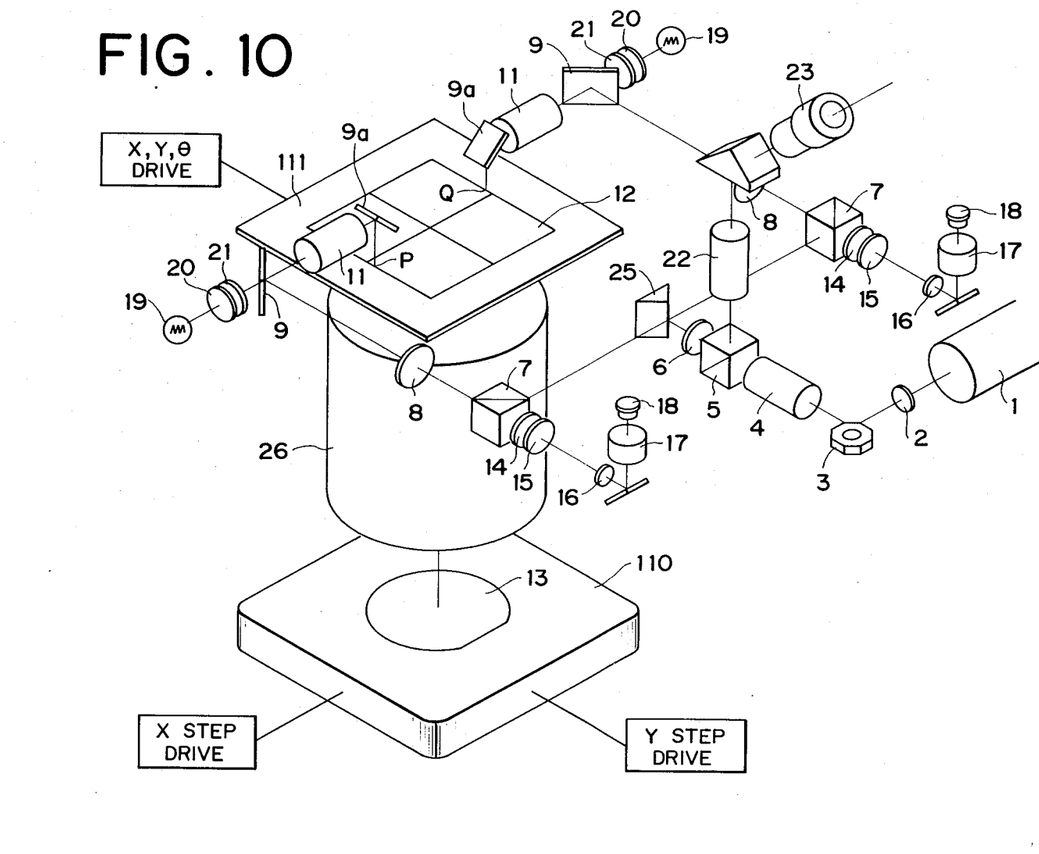
FIG. 10 shows an alignment apparatus usable with a reticle, mask or wafer having the alignment marks of FIG. 9.

FIG. 10 shows an alignment apparatus according to an embodiment of the present invention, wherein the scanning laser beams scan the alignment marks in the longitudinal direction. In order to move the laser beam longitudinally, a combination of mirrors 9 and 9a is used. Similarly to the optical system of FIG. 5, the lefthand and righthand optical systems are asymmetrical so that the objective lens 11 can scan the staggered alignment marks of FIG. 9, for example. In the step-and-repeat system, the pattern of the reticle 12 is projected onto the wafer 13 at each shot, and then stepped to the area of the next shot, and this process is repeated. Therefore, the connection between the adjacent shots is significant. In the apparatus of FIG. 10, the wafer 13, carried on the wafer carrier 110, is stepped and positioned in X and Y directions by an X-step device and a Y-step device so that the chip patterns are formed in orthogonal arrays on the wafer 13. The alignment between the reticle 12 and the wafer 13 is achieved by a reticle holder 111 driven by X, Y and θ drives, which move the reticle holder in X, Y and θ directions in response to the detection of the degree of misalignment measured with the use of the alignment marks.

As described above, the marks P and Q are staggered so that it can be verified that the projected image P or Q does not overlap the alignment mark for the next shot on the wafer 12. It is necessary that the relative positions between the marks are so predetermined that such overlapping can be avoided.

FIG. 6 and FIG. 9B show the alignment marks as being located around and adjacent to the outer peripheries of the pattern area, but the marks may be located on different inside streets at different latitudes.

Figure 11:
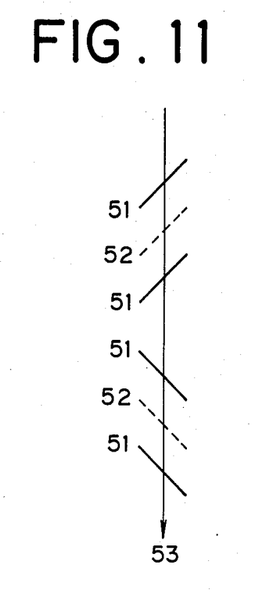
FIG. 11 illustrates a relationship between the scanning line and alignment marks of a reticle or wafer.

As a pattern of the alignment marks, the one shown in FIG. 11 is known. The reticle 12 has the mark 51 to which the mark of the wafer 52 shown by dotted lines can be aligned therewith. The marks are scanned by a laser beam along the line 53. The alignment apparatus of the present invention is of the TTL type, so that the mark on the reticle and the mark on the wafer are simultaneously detected through the reticle. The detection is converted to electric signals, in response to which the mask or reticle 12 and the wafer 13 are brought into alignment. If the marks are positioned as shown in FIG. 9, and if the marks are of the same pattern, there is a possibility that the mark P position and the mark Q position may be confused, that is not discriminated when the reticle 12 and wafer 13 are rotationally moved. This can be avoided by making the directions of the marks P and Q opposite to each other.

Figure 12:
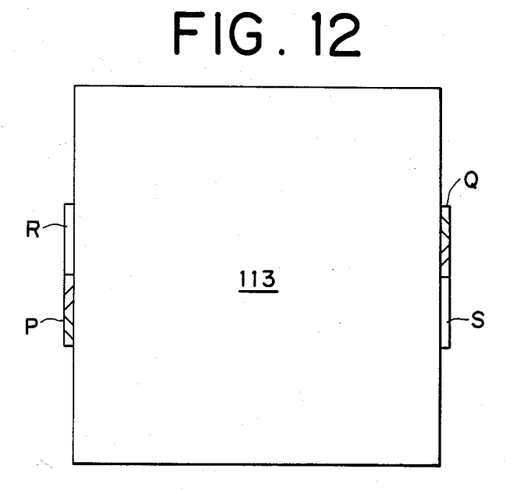
FIG. 12 shows a reticle having alignment marks and light transmitting openings according to an embodiment of the present invention.
Figure 13:
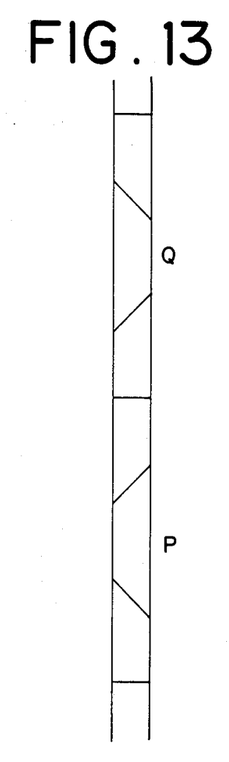
FIG. 13 shows an alignment mark, on a wafer, provided on a scribe line.

FIG. 12 shows such arrangement of alignment marks. The marks P and Q are oriented oppositely in their patterns. Correspondingly thereto, the alignment marks on the wafer scribe lines are formed as shown in FIG.

13. Since the orientations of the marks are opposite to each other, they can be discriminated.

According to the mark arrangements for the reticle or the like of the present invention, described in detail heretofore, the degree of alignment between the mask or reticle 12 and wafer 13 can be improved. Moreover, the undesirable overlapping of the marks can be avoided.

According to the present invention, there is also provided an alignment apparatus usable with such reticle or the like.

Another aspect of the present invention will now be described. When a chip pattern on the reticle is projected or printed onto a wafer, the alignment mark pattern of the reticle is also printed on the wafer at the wafer alignment mark position. Therefore, the area on the wafer corresponding to the reticle alignment mark remains unexposed. The unexposed area is within the alignment mark area on the wafer. If the thus exposed wafer, as it is, is processed by for example, development, diffusion and the like, a vestige of the unexposed part is remains on the wafer alignment mark area. Such vestiges are undesirable in further alignment and exposure operations on the same wafer with another pattern which may be performed on the wafer after such processing, because they may affect the alignment operation even to the extent of disabling the alignment. The present invention provides a solution to this problem. The reticle 12 shown in FIG. 12 of the present invention has windows, R and S, i.e., light transmitting portions adjacent to the alignment marks P and Q which are staggered relative to the periphery of the pattern forming area 113.

When, for example, in FIG. 9 arrangement, the chips 40A, 40B, 40C and 40D are exposed, there remains in the mark 40Q are an unexposed part caused by the reticle alignment mark Q. The mark 40Q area on the wafer, however, is exposed to light through the window R at the next shot exposure, i.e., the shot for the chips 41A, 41B, 41C and 41D. This is repeated with the step-and-repeat exposure, so that the possibility of vestiges for the marks can be avoided.

Figure 14:
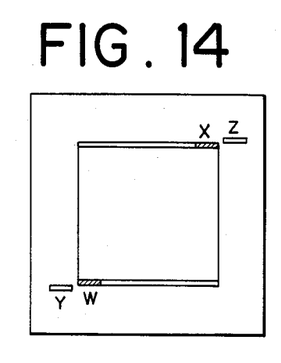
FIG. 14 shows a reticle having alignment marks of FIG. 8 and light transmitting openings.

FIG. 14 shows the windows for the same purpose but usable with the reticle 12 of FIG. 8. The windows are provided as shown by reference numerals Y and Z. The unexposed area remains, for example, in the alignment mark 109G area at the shot for the area 109, and is exposed through the window Z by the shot for the area 108.

According to this aspect of the present invention, the alignment marks on the wafer for a certain pattern area, corresponding to a single or plural chips, can be sufficiently exposed to light at the shot for another pattern area, so that it is not necessary to provide a special step for mark protection. In the step-and-repeat type alignment apparatus, which is required to provide the alignment with very high precision, it is advantageous that the same alignment marks on the wafer can be used, since it means that the reference indexes are stable and unchangeable, so that a factor of causing errors can be eliminated. Also, it is advantageous that plural pairs of alignment marks need not be provided.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for aligning a pattern of a first object sequentially with plural pattern areas of a second object arranged along first and second directions with non-pattern mark regions between adjacent pattern areas, and having mark elements associated with each of said pattern areas provided in first mark areas and second mark areas of said non-pattern mark regions interposing respective pattern areas, said apparatus comprising:

projecting means for projecting the pattern of said first object onto said pattern areas of said second object;

means for producing a detection beam;

first detecting means, having a first detection area, for detecting through said projecting means said first mark area for one of said plurality of pattern areas which is disposed within a projection area of said projecting means, using said detection beam;

second detecting means, having a second detection area which is staggered in both of said first and second directions with said first detection area, for detecting through said projecting means said second mark area for said one of said plurality of pattern areas which is disposed within said projection area of said projecting means, using said detection beam; and means, responsive to said first and second detecting means, for aligning said first object with said pattern area of said second object which is disposed within said projection area of said projecting means.

2. An apparatus according to claim 1, wherein said first and second detecting means include objective lens means for directing the detection beam from said beam generating means to the respective detection areas through said projecting means, wherein a beam path from said beam generating means to said objective lens of said first detecting means and a beam path from said beam generating means to said objective lens of said second detecting means are asymmetrical.

3. An apparatus according to claim 2, said beam generating means produces a laser beam.

4. A reticle for use with a step-and-repeat aligner for sequentially projecting a pattern of a circuit from said reticle onto pattern areas of a wafer in orthogonal arrays through a projection optical system of said aligner said reticle comprising:

a base plate having a plurality of pattern areas;

a circuit pattern formed in each of said pattern areas on said base plate;

a pair of alignment marks located outside and associated with each of said pattern areas and so disposed that each of said pattern areas of said base plate is between said pair of alignment marks; and means for permitting exposure to light by said aligner of alignment marks for one pattern area of said wafer, when another pattern area of said wafer is exposed to said circuit pattern in said pattern area of said reticle.

* * * * *

UNITED STATES PATENT AND TRADEMARK OFFICE
CERTIFICATE OF CORRECTION

PATENT NO. : 4,620,785                                   Page 1 of 2

DATED : November 4, 1986

INVENTOR(S) : AKIYOSHI SUZUKI, ET AL.

It is certified that error appears in the above-identified patent and that said Letters Patent is hereby corrected as shown below:

COLUMN 1

Line 14,   "IC," should read --IC--.
    Line 15,   "circuits)" should read --circuits),--.

COLUMN 2

Line 59-60, "objective." should read --objective lens.--.

COLUMN 3

Line 33,   "pattern" should read --patterns--.

COLUMN 4

Line 58,   "FIG.1" should read --FIG.1 to--.
    Line 60,   "element" should read --elements--.

COLUMN 5

Line 43,   "sheets" should read --streets--.

UNITED STATES PATENT AND TRADEMARK OFFICE
CERTIFICATE OF CORRECTION

PATENT NO. : 4,620,785

DATED : November 4, 1986

INVENTOR(S) : AKIYOSHI SUZUKI, ET AL.

It is certified that error appears in the above-identified patent and that said Letters Patent is hereby corrected as shown below:

COLUMN 7

Line 22,   "is remains" should read --remains--.
    Line 36,   "are an" should read --an--.

COLUMN 8

Line 45,   "2, said" should read --2, wherein said--.

Signed and Sealed this

Seventeenth Day of March, 1987

Attest:

DONALD J. QUIGG

Attesting Officer            Commissioner of Patents and Trademarks